Aug. 5, 1969 YOZO KANDA ET AL 3,460,005

INSULATED GATE FIELD EFFECT TRANSISTORS WITH PIEZOELECTRIC SUBSTRATES

Filed Sept. 27, 1965

INVENTORS
YOZO KANDA
YASUNORI KANAZAWA

BY Paul M. Craig, Jr.
ATTORNEY

United States Patent Office 3,460,005

Patented Aug. 5, 1969

3,460,005

INSULATED GATE FIELD EFFECT TRANSISTORS WITH PIEZOELECTRIC SUBSTRATES

Yozo Kanda, Kodaira-shi, and Yasunori Kanazawa, Hachioji-shi, Japan, assignors to Hitachi Ltd., Tokyo, Japan, a Japanese corporation Filed Sept. 27, 1965, Ser. No. 490,315
Claims priority, application Japan, Sept. 30, 1964, 39/55,221
Int. Cl. H01l 5/00
U.S. Cl. 317—235 8 Claims

ABSTRACT OF THE DISCLOSURE

A transducer including an insulated gate field effect transistor mounted in a piezoelectric crystal substrate secured to means for transmitting a mechanical force to both said substrate and said transducer, with the piezoelectric voltage, produced in the substrate under a mechanical stress, being applied to the gate electrode of the transistor or to its channel under the effect of electric charges induced in the substrate.

This invention relates to mechano-electrical transducers which transform a mechanical signal into an electrical one and is designed to provide a highly sensitive mechano-electrical transducer of novel construction utilizing a thin-film transistor (TFT).

A mechano-electrical transducer has previously been known which utilizes a transistor of the common-emitter connection and in which a mechanical force is applied to the emitter junction of the transistor in a direction at right angles thereto to vary the resistance value of the p-n junction between the emitter and base thereby to vary the current of minority carriers flowing through the p-n junction while causing a large variation in the collector current under the current amplification effect between the base and collector.

With such transducer, however, repetitive application of a mechanical force to the emitter junction inevitably causes a crystallographical dislocation in its vinicinty, varying the life of minority carriers injected from the emitter, and thus causes an irreversible change in performance of the transducer element. In addition, because of the p-n junction formed in the transistor, the performance of the device is substantially influenced by its atmosphere and deteriorates rapidly.

Another previously known mechano-electrical transducer makes use of the piezoresistance effect of a semiconductor. This form of mechano-electrical transducer excels over the above-described transistor device in that it employs majority carriers, but lacks practicality having a sensitivity substantially lower than that of the transistor device.

The present invention has for its object to provide a novel mechano-electrical transducer which excels in performance over any conventional form of mechano-electrical transducer.

Another object of the present invention is to provide a novel mechano-electrical transducer which is extremely limited in variation of its characteristics and in rate of deterioration.

A further object of the present invention is to provide a thin-film transistor of novel construction for use in a mechano-electrical transducer.

To attain these objects, the present invention proposes to employ a thin-film transistor, the substrate of which is formed of a piezoelectric material or a ferroelectric material prepared by poling and to impress the piezoelectric voltage, produced in the substrate under a mechanical stress, upon the gate electrode of the transistor or apply the voltage to its channel under the effect of electric charges induced in the substrate.

The foregoing and other objects, features and advantages of the present invention will become apparent from the following description when taken in conjunction with the accompanying drawing, in which.

In order that the invention may be readily understood, description will first be made of a conventional thin-film transistor with reference to FIG. 1.

Figure 1:
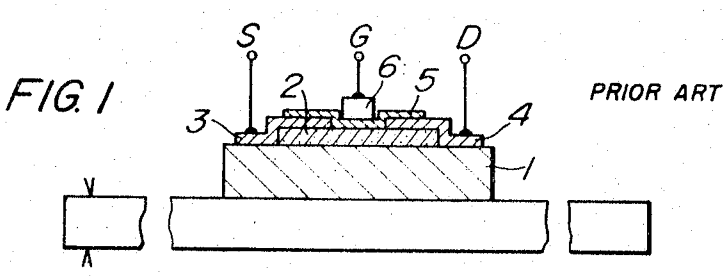
FIG. 1 is a cross-sectional view of a mechano-electrical transducer which employs a conventional form of thin-film transistor arranged to be subjected to a bending moment.

In FIG. 1, reference numeral 1 indicates a glass substrate, on top of which a film 2 of a semiconductor material such as CdS is vapor-deposited and then aluminum electrodes 3 and 4 are vapor-deposited selectively by use of an appropriate mask to serve as source and drain electrodes, respectively, of the thin-film transistor. Thereafter, a thin film 5 of an insulating material, such as SiO or $SiO_2$ is, deposited by an appropriate method such as evaporation or thermal decomposition. In addition, a gate electrode 6 of the thin-film transistor is formed by vapor deposition of Al. Finally, lead wires are secured, for example, by soldering to the source, drain and gate electrodes 3, 4 and 6, respectively, to complete the known TFT structure.

Figure 2:
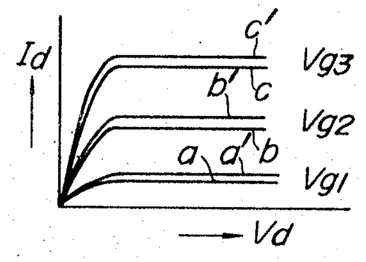
FIG. 2 illustrates the voltage-current characteristics of the thin-film transistor shown in FIG. 1.

The output characteristics, that is, the relations between the drain voltage $Vd$ and drain current $Id$ of the thin-film transistor shown in FIG. 1 are illustrated in FIG. 2 by curves *a*, *b* and *c* for respective fixed gate voltages $Vg_1$, $Vg_2$, and $Vg_3$. Such characteristic curves are typical of thin-film transistors.

Let it be assumed that the thin-film transistor of FIG. 1 is bonded to a steel plate by an appropriate adhesive agent and the plate is bent so that the CdS film 2 of the TFT is subjected to a bending stress. The relations between $Vd$ and $Id$ of the TFT thus subjected to a mechanical stress are shifted as indicated at *a'*, *b'*, and *c'*, respectively, in FIG. 2. On this occasion, it is obvious that the same gate voltages $Vg_1$, $Vg_2$ and $Vg_3$ are maintained. Such shifting cannot be explained clearly but seems to be attributable to the piezoelectric and piezoresistance effects of the semiconductor material employed and to variations of its energy band edge with mechanical stress. This form of mechano-electrical transducer has never been satisfactory for detection of a mechanical variation as converted into an electrical one because of the extremely limited magnitaude of the latter relative to the former.

According to the present invention, the glass substrate of a thin-film transistor as shown in FIG. 1 is replaced by one formed of a piezoelectric material and it is arranged so that a mechanical force applied to the semiconductor is simultaneously applied to the piezoelectric substrate to produce therein a voltage corresponding to the mechanical force. The voltage is impressed as a gate voltage upon the gate electrode of the thin-film transistor. In this manner, it will be appreciated that the transistor is given a gate voltage variable in effect with the mechanical force applied.

Let it be assumed that the $Vd$–$Id$ characteristic of the thin-film transistor when the gate voltage has a value of $Vg_1$ is represented by the curve *a* in FIG. 2. If a bending stress is given to the TFT in this state, the gate voltage of the TFT is caused to vary from $Vg_1$ to, say, $Vg_2$ because of the piezoelectric substrate. This, together with the fact that at the same time the semiconductor material also is subjected to a bending stress, causes an overall change or shifting of the $Vd$–$Id$ characteristic curve of the TFT from $a$ to $b'$ in FIG. 2. This apparently means a change in drain current $Id$ which is extraordinarily large compared to its change from curve $a$ to $a'$ with the conventional TFT shown in FIG. 1.

A few practical examples of the present invention will next be described with reference to FIGS. 3 and 4.

EXAMPLE 1

Figure 3:
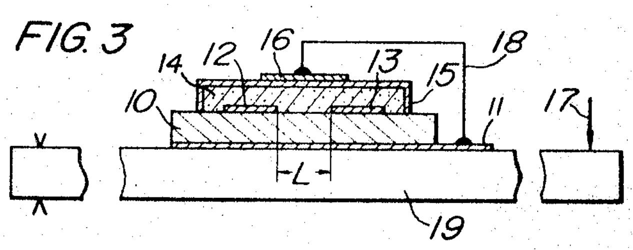
FIG. 3 is a cross-sectional view of a mechano-electrical transducer embodying the present invention.

Referring to FIG. 3, which illustrates one form of mechano-electrical transducer embodying the present invention, reference numeral 10 indicates a substrate of a piezoelectric material prepared by its poling and dimensioned 10 mm. x 2 mm. x 0.1 mm. The substrate can, for example, be prepared by poling a PZT ceramic (a trade name given to a sintered mixture containing 53% or $PbZrO_3$ and 47% of $PbTiO_3$ in a field of 80 kv./cm.). Reference numeral 11 indicates one of the Al metal electrodes employed in the poling of the ferroelectric material; and reference numerals 12 and 13 indicate electrodes spaced apart from each other a distance L of approximately 10$\mu$ and formed by partly removing the other of said Al metal electrodes, for example, by chemical etching, mechanical separation or electron-beam etching. A layer 14 of CdS of 1$\mu$ thickness is formed by vapor deposition on that surface of the piezoelectric substrate which carries the two electrodes. Formed on the surface of the CdS layer is a film 15 of SiO or $SiO_2$ of 500 A. thickness. Finally, an Al metal electrode 16 is vapor-deposited on top of the film 15 to complete a TFT structure. Electrodes 12, 13 and 16 serve as source, drain and gate electrodes, respectively, of the TFT.

One form of mechano-electrical transducer embodying the present invention can be obtained by bonding the TFT described above onto a steel plate 19 of 1 mm. thickness by an appropriate adhesive agent. In operation of this form of transducer, if a mechanical signal 17 is given to one end of the steel plate 16 with its other end fixed, the value of current flowing between the source and drain electrodes of the TFT is varied. On this occasion, obviously it is necessary to connect the substrate electrode 11 to the gate electrode 16 by a lead wire as indicated at 18.

With this arrangement, when a mechanical force 17 was applied to the steel plate 19 to cause an 8$\mu$ bend of the TFT, a drain current $Id$ of 0.03 ma. was obtained with a drain voltage of 1 v. and a voltage of 0.5 v. was produced in the piezoelectric substrate. With a transducer similar to this embodiment but including a TFT the substrate of which was conventionally made of glass instead of a piezoelectric material, a drain current of 0.01 ma. was obtained under the same conditions. This reveals the fact that the mechano-electrical transducer according to the present invention exhibits a performance approximately three times as high as that obtainable with conventional units.

EXAMPLE 2

Figure 4:
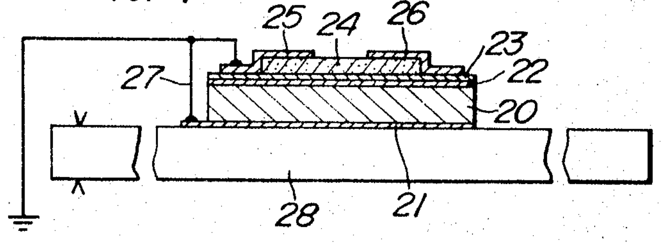
FIG. 4 is a view similar to FIG. 3 illustrating another embodiment of the present invention.

FIG. 4 illustrates another embodiment of the present invention. This embodiment also includes a PZT substrate 20, on the opposite surfaces of which metallic electrode layers 21 and 22 are formed. A thin insulating layer 23, for example, of $SiO_2$ is coated over the upper surface of one of the electrodes 22 and on this layer 23 is vapor-deposited a layer 24 of a semiconductor such as CdS. Two metallic electrodes 25 and 26 are vapor-deposited on the respective ends of the CdS layer 24 to complete a thin-film transistor. Metallic layers 25, 26 and 22 serve as source, drain and gate electrodes, respectively, of the TFT. A lead wire 27 is employed to connect the substrate electrode 21 with the source electrode 25. The TFT is bonded to a steel plate with an adhesive agent to form a mechano-electrical transducer embodying the present invention.

While but two embodiments of the invention have been shown and described, herein, it will be understood that many changes and modifications may be made therein without departing from the spirit or scope of the invention. For example, in place of CdS employed in the embodiments described, Ge, InSb, $TiO_2$ or other semiconductor material may be employed. Also, the $SiO_2$ film may be replaced by a film of other insulating material such as resin. The substrate of the TFT may be formed of any of known piezoelectric materials besides PZT, including quartz, tourmaline, Rochelle salt, potassium chlorate ($KClO_3$), zinc blende (ZnS), ammonium sodium tartrate ($NH_4NaC_4H_4C_6 \cdot 4H_2O$), tartaric acid ($C_4H_6O_6$), sucrose ($C_{12}H_{22}O_{11}$) and barium titanate ($BaTiO_3$). Further, the mechanical signal usable in the present invention is not limited to a bending stress but may take the form of a pressure, tension, torsion or other mechanical stress. Among others, the pressure form of signal is recommended for its convenience in use.

What is claimed is:

1. An insulated gate thin film transducer comprising: a piezoelectric crystal substrate; a thin film transistor including a thin semiconductor layer deposited on said substrate, source and drain electrodes provided on separate surface portions of said semiconductor layer and a gate electrode provided on another surface portion of said semiconductor layer with a thin insulation layer interposed between said gate electrode and said semiconductor layer, said gate electrode being located on the semiconductor region between the source and drain electrodes; means for simultaneously applying a mechanical force to the piezoelectric crystal substrate and said semiconductor layer of said thin film transistor; and means for applying a piezoelectric voltage produced in the piezoelectric crystal substrate, across the semiconductor region between the source and drain electrodes, whereby the resistivity of said semiconductor region between the source and drain electrodes is caused to vary in accordance with the mechanical force applied thereto so as to control the flow of majority carriers between the source and drain electrodes.

2. An insulated gate thin film transducer as defined in claim 1 in which the thin semiconductor layer consists of at least one material selected from the group essentially consisting of CdS, InSb, and $TiO_2$.

3. An insulated gate thin film transducer as defined in claim 1 wherein said force applying means includes an elastic metal plate bonded to said substrate of piezoelectric material, whereby the mechanical force applied to said metal plate is also applied to said substrate and said layer of semiconductor material.

4. An insulated gate thin film transducer as defined in claim 1 wherein said voltage applying means includes a conductive layer disposed between said piezoelectric crystal substrate and said force applying means and an electrical connection between said conductive layer and said gate electrode.

5. An insulated gate thin film transducer as defined in claim 1 in which the piezoelectric material consists of at least one material selected from the group essentially consisting of PZT ceramic, quartz, tourmaline, Rochelle salt, potassium chlorate, zinc blende, ammonium sodium tartrate, tartaric acid, sucrose and barium titanate.

6. An insulated gate thin film transducer as defined in claim 1 in which said source and drain electrodes are located between one surface of said substrate of piezoelectric material and one surface of said thin semiconductor layer facing thereto, and said gate electrode is located on the opposite surface of said thin semiconductor layer, and said force applying means including an elastic metal plate bonded to said substrate of piezoelectric material, whereby the mechanical force applied to said metal plate is also applied to the substrate of piezoelectric material and said layer of semiconductor material.

7. An insulated gate thin film transducer as defined in claim 1 in which said gate electrode is located between one surface of said substrate of piezoelectric material and said insulating layer on one surface of said thin semiconductor layer facing to the substrate of piezoelectric material, said source and drain electrodes are located on the opposite surface of said semiconductor layer, said force applying means including an elastic metal plate bonded to said substrate of piezoelectric material, whereby the mechanical force being applied to the substrate of piezoelectric material and the semiconductor layer.

8. An insulated gate thin film transducer as defined in claim 7 wherein a conductive layer is disposed between said substrate and said metal plate, said conductive layer being electrically connected to said source electrode.

References Cited

UNITED STATES PATENTS

| | | | |
|---|---|---|---|
| 2,898,477 | 8/1959 | Hoestery | 307—88.5 |
| 3,123,788 | 3/1964 | Pfann et al. | 338—4 |
| 3,186,217 | 6/1965 | Pfann | 73—88.5 |
| 3,287,506 | 11/1966 | Hahnlein | 179—110 |
| 3,294,988 | 12/1966 | Packard | 310—8 |
| 3,298,863 | 1/1967 | McCusker | 117—212 |
| 3,351,786 | 11/1967 | Muller et al. | 310—8 |
| 3,369,159 | 2/1968 | Sihvonen et al. | 317—235 |
| 3,377,588 | 4/1968 | Picquendar | 343—8 |

JOHN W. HUCKERT, Primary Examiner

R. SANDLER, Assistant Examiner

U.S. Cl. X.R.

29—571